(12) United States Patent
Ando

(10) Patent No.: US 9,305,960 B2
(45) Date of Patent: Apr. 5, 2016

(54) SEMICONDUCTOR DEVICE AND METHOD OF MANUFACTURING THE SAME

(71) Applicant: CANON KABUSHIKI KAISHA, Tokyo (JP)

(72) Inventor: Yuuya Ando, Yokohama (JP)

(73) Assignee: CANON KABUSHIKI KAISHA, Tokyo (JP)

(*) Notice: Subject to any disclaimer, the term of this patent is extended or adjusted under 35 U.S.C. 154(b) by 0 days.

(21) Appl. No.: 14/666,820

(22) Filed: Mar. 24, 2015

(65) Prior Publication Data

US 2015/0287758 A1 Oct. 8, 2015

(30) Foreign Application Priority Data

Apr. 4, 2014 (JP) ................................. 2014-078231

(51) Int. Cl.
*H01L 23/48* (2006.01)
*H01L 29/40* (2006.01)
*H01L 27/146* (2006.01)

(52) U.S. Cl.
CPC .... *H01L 27/14636* (2013.01); *H01L 27/14621* (2013.01); *H01L 27/14623* (2013.01); *H01L 27/14627* (2013.01); *H01L 27/14687* (2013.01)

(58) Field of Classification Search
CPC ................... H01L 27/14636; H01L 27/14687
USPC ......................................................... 257/774
See application file for complete search history.

(56) References Cited

U.S. PATENT DOCUMENTS 8,264,083 B2 * 9/2012 Nawata et al. ................ 257/758
9,076,759 B2 * 7/2015 Chen et al.
2006/0118965 A1 6/2006 Matsui

FOREIGN PATENT DOCUMENTS

JP 2005-026405 A 1/2005
JP 2011-199314 A 10/2011

* cited by examiner

*Primary Examiner* — Theresa T Doan
(74) *Attorney, Agent, or Firm* — Fitzpatrick, Cella, Harper & Scinto

(57) ABSTRACT

A method of manufacturing a semiconductor device is provided. The method comprises a first step of forming a first hole opened to a side of a first surface of a semiconductor substrate, the semiconductor substrate including the first surface and a second surface opposite to the first surface, a step of filling the first hole with an insulating member, a step of forming, on the first surface, an insulating film that covers the insulating member, a step of forming a second hole in the insulating film and the insulating member, a step of filing the second hole with a conductive member, a step of thinning the semiconductor substrate from the side of the second surface of the semiconductor substrate so as to expose the insulating member.

9 Claims, 4 Drawing Sheets

SEMICONDUCTOR DEVICE AND METHOD OF MANUFACTURING THE SAME

BACKGROUND OF THE INVENTION

1. Field of the Invention

The present invention relates to a semiconductor device and a method of manufacturing the same.

2. Description of the Related Art

Concerning formation of an electrode extending through a silicon substrate, when forming an opening to pass the electrode, the opening is formed simultaneously in an interlayer dielectric film and the silicon substrate using a photoresist as a mask. After the opening formation, the photoresist is removed. In the above-described manufacturing method, however, a deposit generated from the silicon substrate and a deposit generated from the interlayer dielectric film, which are generated at the time of opening formation, mix and adhere to the photoresist. The adhered deposit mixture makes photoresist removal after that difficult.

To prevent this, Japanese Patent Laid-Open No. 2011-199314 discloses a manufacturing method of forming an opening in an interlayer dielectric film using a photoresist as a mask, removing the photoresist, and then forming an opening in a silicon substrate using the interlayer dielectric film as a hard mask. According to this manufacturing method, since the opening is formed only in the interlayer dielectric film using the photoresist as a mask, the deposits do not mix, and the photoresist can easily be removed.

SUMMARY OF THE INVENTION

In the manufacturing method of Japanese Patent Laid-Open No. 2011-199314, the interlayer dielectric film is also etched upon etching the silicon substrate, and the edge of the hole in the interlayer dielectric film is rounded, and the opening becomes larger. When the distance between through electrodes is reduced, the rounded edge may cause a short circuit in the wires or electrode portions. Hence, the distance between the through electrodes cannot be made short, and micropatterning is impossible. According to an aspect of the present invention, there is provided a technique more advantageous in simplifying and stabilizing steps in the semiconductor manufacturing method of forming a through electrode.

According to some embodiments, a method of manufacturing a semiconductor device is provided. The method comprises a first step of forming a first hole opened to a side of a first surface of a semiconductor substrate, the semiconductor substrate including the first surface and a second surface opposite to the first surface, a step of filling the first hole with an insulating member, a step of forming, on the first surface, an insulating film that covers the insulating member, a step of forming a second hole in the insulating film and the insulating member, a step of filing the second hole with a conductive member, and a step of thinning the semiconductor substrate from the side of the second surface of the semiconductor substrate so as to expose the insulating member.

Further features of the present invention will become apparent from the following description of exemplary embodiments (with reference to the attached drawings).

DESCRIPTION OF THE EMBODIMENTS

The embodiments of the present invention will now be described with reference to the accompanying drawings.

First Embodiment

Figure 1A:
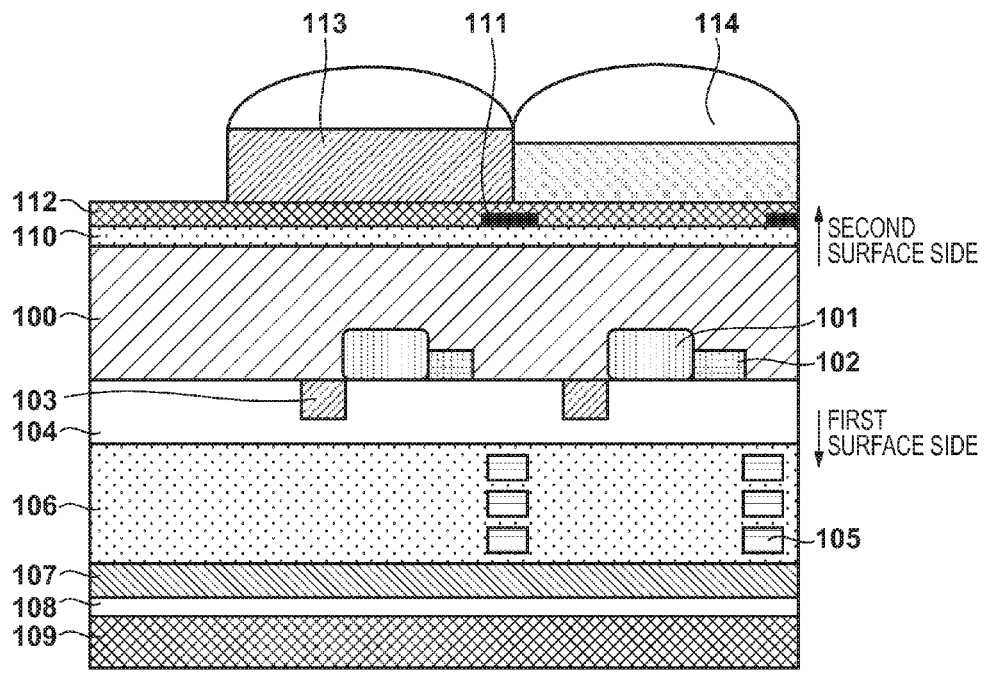
FIGS. 1A and 1B are sectional views showing the schematic arrangement of a solid-state image sensor serving as a semiconductor device according to an embodiment of the present invention and a section of the peripheral portion of the solid-state image sensor.

FIG. 1A is a schematic sectional view of a semiconductor device according to this embodiment. The semiconductor device includes, for example, a solid-state image sensor such as a CMOS image sensor. The embodiment of the present invention will be described below using a solid-state image sensor as an example of the semiconductor device. A semiconductor layer 100 is, for example, a silicon layer (silicon substrate) and corresponds to a semiconductor substrate of the present invention. A plurality of photodiodes 101 that are photoelectric conversion portions constructing unit pixels are formed in the silicon substrate 100. Each photodiode 101 is formed from a p-n junction formed by injecting an n-type impurity into the p-type silicon substrate 100.

An n-type semiconductor region 102 serving as a source or drain region of a transistor or a floating diffusion FD and a p-type channel stop portion configured to prevent signal charges from flowing between the pixels are formed in the silicon substrate 100. The first surface of the silicon substrate 100 is an element formation surface where a predetermined semiconductor element is formed. A gate electrode 103 of a transistor is formed on a gate insulating film made of, for example, silicon oxide on the first surface. An interlayer dielectric film 104 is formed on the first surface of the silicon substrate 100 so as to cover the transistor. A wiring structure 106 including multilayers of metal wires 105 is formed on the interlayer dielectric film 104. A protective film 107 is formed on the wiring structure 106.

A support substrate 109 is provided on an adhesive layer 108 on the protective film 107. The support substrate 109 is provided to increase the strength of the silicon substrate 100 and the entire solid-state image sensor. The support substrate 109 is formed from, for example, a semiconductor layer. A dielectric film 110 capable of functioning as an anti-reflection film is formed on the side of the second surface opposite to the first surface of the silicon substrate 100. A light-shielding film 111 having opening portions corresponding to the portions of the photodiodes 101 is formed on the dielectric film 110. A protective film 112 is formed on the dielectric film 110 so as to cover the light-shielding film 111. The protective film 112 is formed from, for example, a silicon oxide film. Color filter layers 113 each of which passes only light in a desired wavelength range are formed on the protective film 112. An on-chip lens 114 configured to condense incident light on the photodiode 101 is formed on each color filter layer 113.

Pads used to input/output external signals are provided around the solid-state image sensor shown in FIG. 1A. FIG.

1B is a sectional view showing details of the solid-state image sensor in the peripheral portion where the pads are arranged.

Figure 1B:
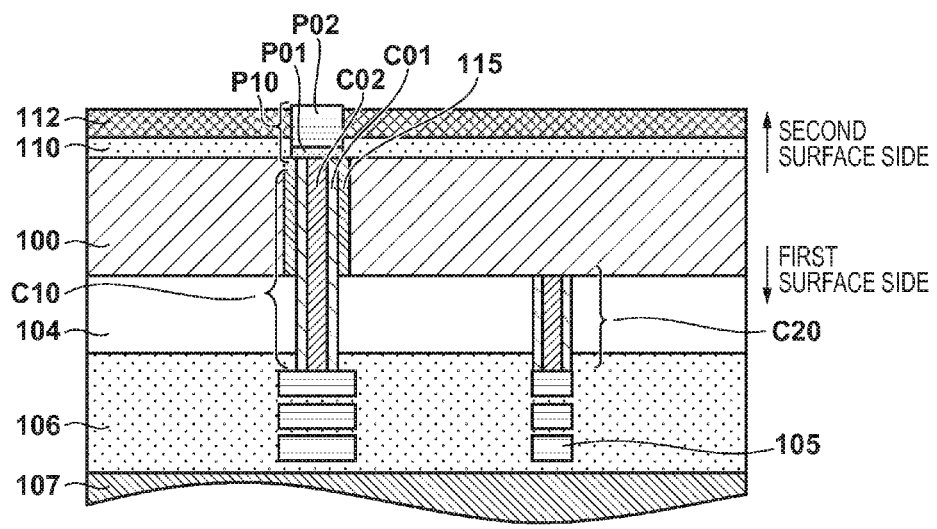

As shown in FIG. 1B, the interlayer dielectric film 104 is formed on the first surface of the silicon substrate 100. The interlayer dielectric film 104 is formed from, for example, a silicon oxide film or a silicate glass film. A conductive member C10 is formed so as to extend through the silicon substrate 100 and the interlayer dielectric film 104. The conductive member C10 is a through electrode that electrically connects a pad P10 to be described later to a pixel portion or a peripheral circuit. A sidewall insulating member 115 configured to electrically insulate the silicon substrate 100 from the conductive member C10 is formed between the silicon substrate 100 and the conductive member C10. The conductive member C10 is formed from a barrier metal C01 and a conductive layer C02.

A contact plug C20 is further formed in the interlayer dielectric film 104. The contact plug C20 is connected to the gate electrode 103 or semiconductor region of the transistor formed in the silicon substrate 100. The contact plug C20 connects the transistors of pixel portions or peripheral circuits. The contact plug C20 is formed from the barrier metal C01 and the conductive layer C02, like the conductive member C10.

The wiring structure 106 is formed on the interlayer dielectric film 104. The wiring structure 106 includes an insulator formed from an interlayer dielectric film, a diffusion barrier film, or the like and the wires 105 formed in the insulator. The insulator of the wiring structure 106 is formed from, for example, a silicon oxide film. FIGS. 2A to 2F show an example of a 3-layer wiring. The wires 105 are connected to the conductive member C10 and the contact plug C20.

The protective film 107 is formed on the wiring structure 106. Although not illustrated in FIG. 1B, the support substrate 109 is provided on the adhesive layer 108 on the protective film 107, as shown in FIG. 1A. The support substrate 109 is formed from a silicon substrate. The dielectric film 110 is formed on the side of the second surface of the silicon substrate 100. The dielectric film 110 has a two-layer structure of, for example, a silicon oxide layer and a silicon nitride layer. The pad P10 connected to the conductive member C10 via an opening in the dielectric film 110 is formed on the conductive member C10 on the side of the second surface of the silicon substrate 100. The pad P10 is formed from a barrier metal P01 and a conductive layer P02. The protective film 112 is formed on the dielectric film 110. The protective film 112 has an opening at a portion corresponding to the pad P10 to attain electrical connection from outside.

A method of manufacturing the solid-state image sensor according to the embodiment will be described next with reference to FIGS. 2A to 3E. FIGS. 2A to 3E are sectional views for explaining an example of a step of forming a pad arrangement region shown in FIG. 1B.

Figure 2A:
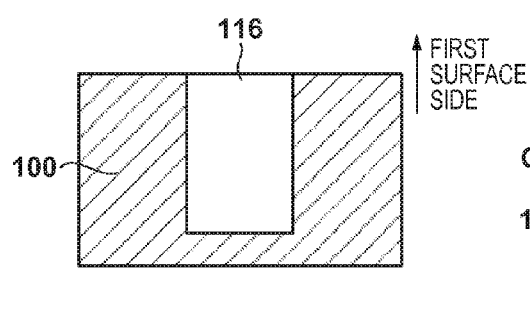
FIGS. 2A to 2F are sectional views showing steps in the manufacture of the solid-state image sensor according to the embodiment of the present invention.

First, as shown in FIG. 2A, mask patterning is performed on the side of the first surface of a silicon substrate 100. The silicon substrate 100 is etched from the side of the first surface of the silicon substrate 100 using the mask. A hole 116 (first hole) is thus formed. Here, the first surface is assumed to be the upper surface of the silicon substrate 100 shown in FIG. 2A. Note that the lower surface is the second surface. In the etching step of forming the hole 116, the etching is stopped halfway through the silicon substrate 100 in the depth direction. For this reason, the hole 116 opens to the side of the first surface and is formed as a hole with a bottom formed from the silicon substrate 100. At this time, the thickness of the silicon substrate 100 is 100 to 1,000 μm. On the other hand, the opening depth of etching is smaller than 100 μm, for example, about 3 μm. After that, an insulating film as a prospective insulating member 117 is formed. The insulating film as the prospective insulating member 117 is, for example, a silicon nitride film or a silicon oxide film. The insulating film as the prospective insulating member 117 is formed along the inner wall of the hole 116, and the hole 116 is filled with the insulating film. In addition, the insulating film as the prospective insulating member 117 is formed along the first surface.

Figure 2B:
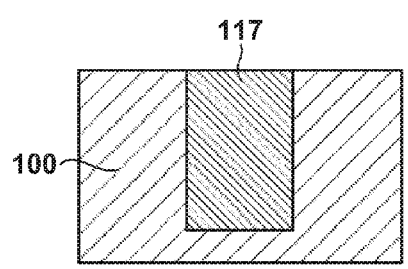

Next, the insulating film as the prospective insulating member 117 is polished and planarized by CMP or the like. As shown in FIG. 2B, by etchback, the insulating film as the prospective insulating member 117 is etched, and the insulating film remaining on the first surface outside the hole 116 is removed to expose the first surface of the silicon substrate 100. The insulating member 117 is thus formed in the hole 116. Note that the insulating film may be removed by CMP until the first surface is exposed. After that, transistors and photodiodes that are various kinds of semiconductor elements forming the pixel portions and the peripheral circuits are formed in the silicon substrate 100. After that, an interlayer dielectric film 104 that covers the transistors and the photodiodes is formed on the first surface of the silicon substrate 100. The interlayer dielectric film 104 covers the insulating member 117 filling the hole 116 as well. A resist pattern used to form a hole to bury a conductive member C10 is formed on the interlayer dielectric film 104. The resist pattern used to form the opening for the conductive member C10 is formed into a diameter smaller than that of the hole 116.

Figure 2C:
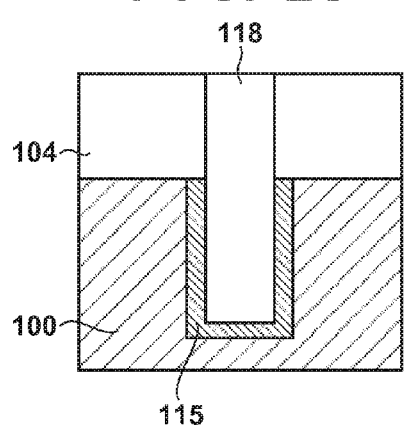

As shown in FIG. 2C, the interlayer dielectric film 104 and the insulating member 117 filling the hole 116 are dry-etched using the resist pattern as a mask. A hole 118 (second hole) is thus formed in the interlayer dielectric film 104 and the insulating member 117. At this time, when the etching step is stopped halfway through the insulating member 117, the hole 118 can be formed as a hole with a bottom formed from the insulating member 117. Alternatively, etching may be performed through the insulating member 117 so that the silicon substrate 100 forms the bottom of the hole 118. At this time, since the diameter of the hole 118 is smaller than that of the hole 116, the insulating member 117 remains around the hole 118 and becomes the sidewall insulating member 115. The sidewall insulating member 115 has a function of electrically insulating the conductive layer buried in the hole 118 from the silicon substrate 100. After the dry etching, the resist pattern is removed.

Figure 2D:
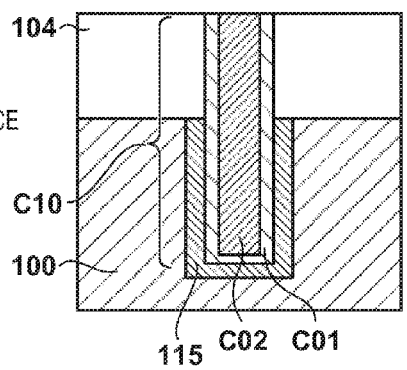

As shown in FIG. 2D, a barrier metal C01 is formed so as to cover the inner surface of the hole 118. After that, a conductive layer C02 is formed so as to fill the hole 118. Then, the extra parts of the conductive layer C02 and the barrier metal C01 formed outside the hole 118, that is, on the interlayer dielectric film 104 are removed. A part of the interlayer dielectric film 104 may also be removed as needed. Etchback or CMP can be used for removal. The conductive member C10 formed from the barrier metal C01 and the conductive layer C02 is thus formed in the hole 118.

Next, the interlayer dielectric film 104 is dry-etched using a predetermined resist pattern to form a contact hole at the formation position of a contact plug C20. After that, the resist pattern is removed. As in formation of the conductive member C10, the barrier metal C01 is formed so as to cover the inner surface of the contact hole, and the conductive layer C02 is formed so as to fill the contact hole.

Figure 2E:
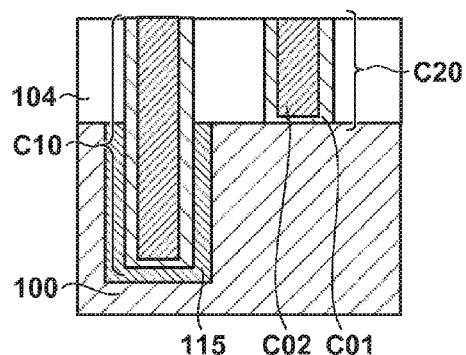

As shown in FIG. 2E, the extra parts of the conductive layer C02 and the barrier metal C01 formed outside the contact hole, that is, on the interlayer dielectric film 104 are removed. A part of the interlayer dielectric film 104 may also be removed as needed. Etchback or CMP can be used for removal, as in formation of the conductive member C10. The contact plug C20 formed from the barrier metal C01 and the conductive layer C02 is thus formed in the contact hole.

Figure 2F:
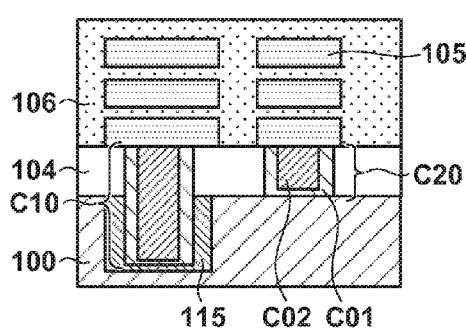

As shown in FIG. 2F, a wiring structure 106 is formed on the interlayer dielectric film 104. When forming the wiring structure 106, a step of forming an interlayer dielectric film, a step of forming a via hole in the interlayer dielectric film, a step of forming a via plug in the via hole, and a step of forming a wire 105 on the interlayer dielectric member are repetitively performed. Each wire is connected to the contact plug C20 via a plug.

Figure 3A:
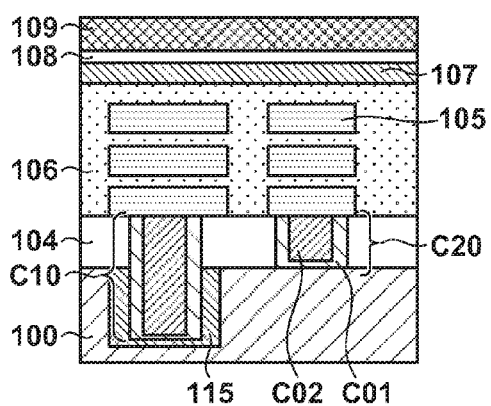
FIGS. 3A to 3E are sectional views showing remaining steps in the manufacture of the solid-state image sensor according to the embodiment of the present invention.

As shown in FIG. 3A, a protective film 107 is formed on the wiring structure 106. After that, a support substrate 109 is bonded to the side of the first surface of the silicon substrate 100 via an adhesive layer 108. The support substrate 109 is thus provided on the protective film 107 via the adhesive layer 108.

Figure 3D:
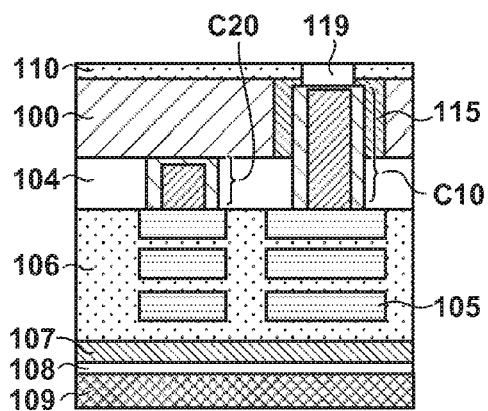
Figure 3B:
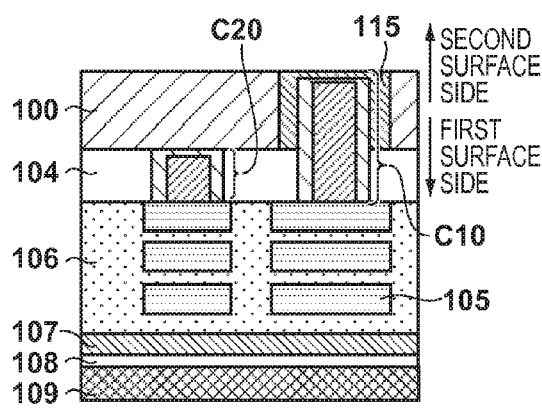

As shown in FIG. 3B, the silicon substrate 100 is polished from the side of its second surface and made thin. At this time, the polishing step is performed until the sidewall insulating member 115 filling the hole 116 is exposed to the side (same side as the second surface) opposite to the first surface of the silicon substrate 100. The sidewall insulating member 115 can function as a stopper in polishing. Note that from FIG. 3B, the structure turned upside down with respect to FIG. 3A will be explained. As shown in FIG. 3C, a dielectric film 110 is formed on the side of the second surface of the silicon substrate 100. The dielectric film 110 can be a multilayered film formed from a silicon oxide layer and a silicon nitride layer. However, the dielectric film 110 may be a single-layered film.

As shown in FIG. 3D, a resist pattern is formed on the dielectric film 110 to form an opening in the dielectric film 110 on the conductive member C10. After that, the dielectric film 110 and the insulating member 117 are dry-etched. After the etching step, the conductive member C10 is exposed to the side of the second surface of the silicon substrate 100. An opening portion 119 reaching the conductive member C10 is thus formed. Then, the resist pattern is removed. The opening diameter of the opening portion 119 is smaller than that of the conductive member C10 in this example, but may be larger. An example has been explained here in which the opening portion 119 is formed in the sidewall insulating member 115 as well, thereby exposing the conductive member C10. However, the conductive member C10 may be exposed in the polishing step for making the silicon substrate 100 thin.

Figure 3E:
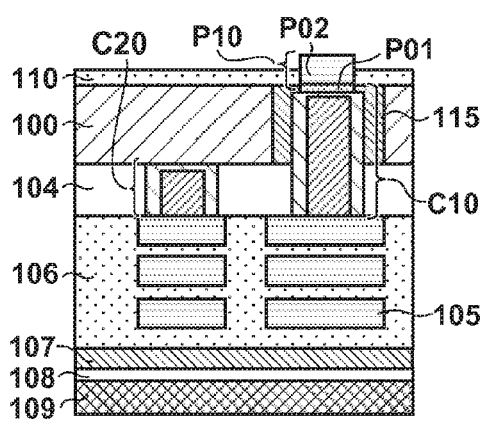
Figure 3C:
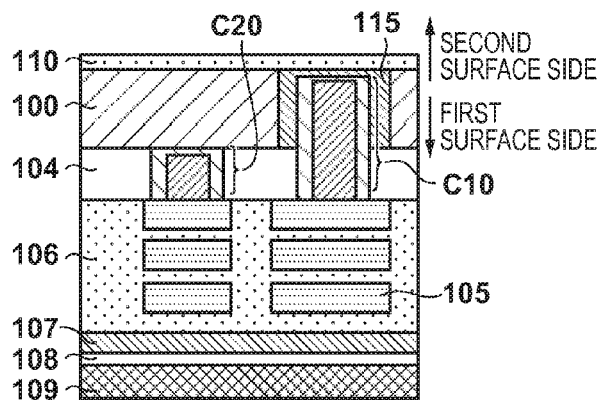

As shown in FIG. 3E, a barrier metal P01 and a conductive layer P02 are sequentially formed to fill the opening portion 119. After that, a resist pattern is formed on the conductive layer P02, and etching is performed to form a pad P10. At this time, a light-shielding film 111 is simultaneously formed in the pixels. Note that the diameter of the pad P10 is smaller than that of the conductive member C10 in this example, but may be larger.

After that, as shown in FIG. 1A, a protective film 112 that covers the pad P10 and the light-shielding film 111 are formed on the dielectric film 110. The protective film 112 is formed from, for example, a silicon oxide film. The protective film 112 can be either a multilayered film or a single-layered film. Next, a color filter material is applied to the entire surface and patterned, thereby forming a color filter layer 113. A lens material is applied onto the color filter layer 113 and patterned, thereby forming an on-chip lens 114. The color filter layer and the on-chip lens are arranged only in the pixel portions. For this reason, a resist pattern is formed, and the color filter layer 113 and the on-chip lens 114 outside the pixel portions are removed. Then, the protective film 112 on the pad P10 is removed by etching to expose the pad P10 to input/output a signal from/to the outside. The solid-state image sensor according to this embodiment is manufactured in the above-described way.

According to the above embodiment, after a first hole is formed in the silicon substrate, an insulating material is buried in the first hole, and an insulating film is further formed on it, thereby easily forming a second hole to provide a conductive member. Since the interlayer dielectric film is not used as a hard mask, it is possible to suppress etching of the interlayer dielectric film upon etching the silicon substrate and rounding of the edge of the hole in the interlayer dielectric film. It is therefore possible to effectively prevent a short circuit in the wires or electrode portions.

Second Embodiment

Figure 4A:
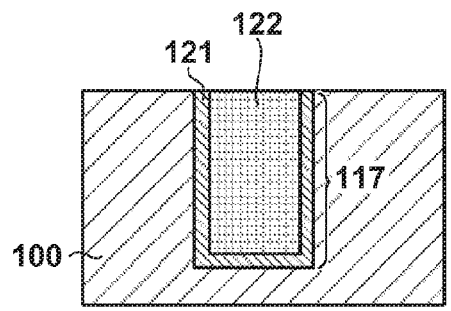
FIGS. 4A to 4E are sectional views showing remaining steps in the manufacture of a solid-state image sensor according to the second and third embodiments of the present invention.

As in the above-described first embodiment, as shown in FIG. 2A, a silicon substrate 100 is etched to form a hole 116. After that, an insulating film as a prospective insulating member 117 is formed. Unlike the first embodiment, the insulating film as the prospective insulating member 117 is a multilayered film formed from a plurality of types of insulating layers different from each other. A first insulating layer 121 that is the first layer of the multilayered film is formed along the inner wall of the hole 116. To cover the inner wall of the hole 116, the first insulating layer 121 is formed so thin as not to fill the hole 116. The first insulating layer 121 is, for example, a silicon nitride layer. Here, for example, the first insulating layer 121 is formed to about 50 nm. Next, a second insulating layer 122 whose etching resistance is different from that of the first insulating layer 121 is formed thicker than the first insulating layer 121. The hole 116 is filled with the second insulating layer 122. The second insulating layer 122 is, for example, a silicon oxide layer. As in the first embodiment, the extra insulating film outside the hole 116 is removed, thereby forming the insulating member 117. FIG. 4A is a sectional view at this time.

Figure 4D:
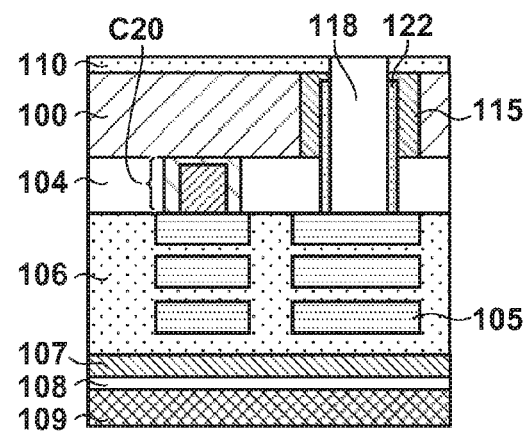
Figure 4B:
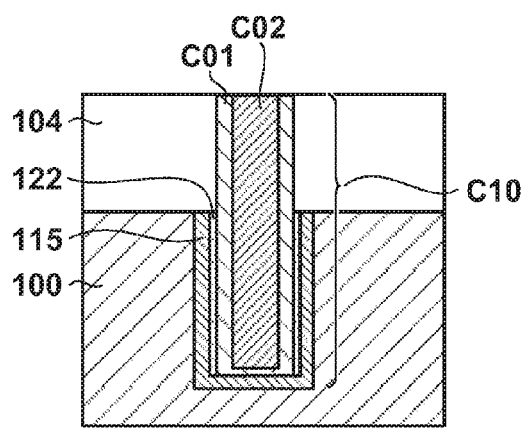

After that, as in the first embodiment, after an interlayer dielectric film 104 is formed on the first surface of the silicon substrate 100, a resist pattern used to form a conductive member in the interlayer dielectric film 104 is formed. The interlayer dielectric film 104 and the insulating member 117 filling the hole 116 are dry-etched using the resist pattern as a mask. At this time, the etching step is stopped halfway through the insulating member 117 in the depth direction, thereby forming a hole 118 as a hole with a bottom formed from the first insulating layer 121 or the second insulating layer 122. The hole 118 is thus formed in the interlayer dielectric film 104 and the insulating member 117. When the bottom is formed from the second insulating layer 122, the hole 118 extends through the second insulating layer 122 in the depth direction to expose the first insulating layer 121. At this time, the second insulating layer 122 may be etched under a condition that the first insulating layer 121 serves as an etching stopper. The opening of the hole 118 can be formed inside the second insulating layer 122 filling the hole 116. With this process, a structure can be obtained in which the second insulating layer 122 exists around the hole 118, and the first insulating layer 121 further exists around it. FIG. 4B is a sectional view at this time. Note that the periphery of the hole 118 may match that of the second insulating layer 122. After that, the steps of FIGS. 2E to 3E are performed, as in the first embodiment, and a solid-state image sensor according to this embodiment is manufactured. The insulating member 117 formed from the first insulating layer 121 and the second insulating layer 122 functions as an insulating protective film that electrically insulates a conductive layer C02 buried in the hole from the silicon substrate 100.

In this embodiment, the hole 116 is filled with two types of insulating layers having different etching resistances. Hence, when forming the hole 118, even if side etching occurs, the etching stops in the second insulating layer 122. Hence, the insulating member 117 can reliably be left around the hole 118. This makes it possible to ensure insulation between the silicon substrate 100 and a conductive member C10 buried in the hole 118. When the thickness of the silicon substrate 100 increases, the amount of dry etching necessary to form the hole 118 increases, and the amount of side etching inevitably increases. In the second embodiment, even if the increase in side etching occurs, the insulation between the silicon substrate and the conductive layer buried in the through hole can be ensured, and the stability of steps can be maintained. Note that in this embodiment, two types of insulating layers having different etching resistances are used in the insulating member 117 filling the hole 116. However, the number of types of insulating layers of the insulating member is not limited to two, and three or more types of insulating layers may be used.

Third Embodiment

In this embodiment, the timing and direction of forming a hole 118 are different from the first and second embodiments. As shown in FIG. 4A, a hole 116 is formed from the side of the first surface, and an insulating member 117 is formed, thereby filling the hole 116, as in the second embodiment. Note that the hole 116 may be filled with only one type of insulator, as shown in FIG. 2B. After that, an interlayer dielectric film 104 is formed. Then, unlike the second embodiment, only a contact plug C20 is formed without forming a conductive member.

Figure 4E:
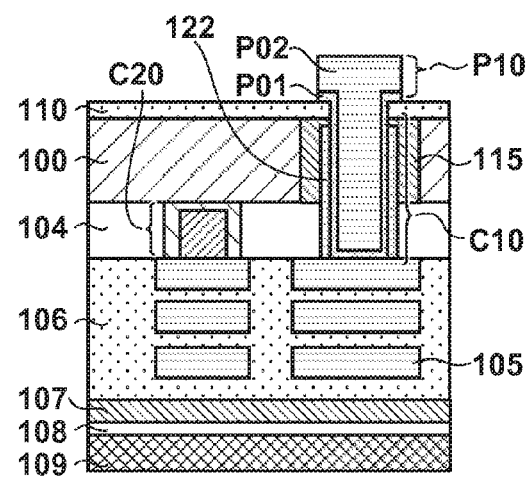
Figure 4C:
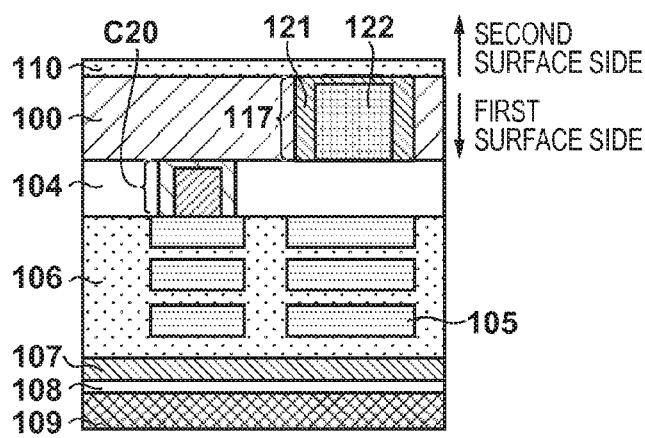

Next, the steps of FIGS. 2F to 3C including the thinning step from the side of the second surface are performed as in the second embodiment, and a dielectric film 110 is formed. FIG. 4C is a sectional view at this time. With the thinning, the insulating member 117 is exposed to the side of the second surface of a silicon substrate 100, and the dielectric film 110 covers it. Next, a resist pattern is formed on the dielectric film 110 to open the hole 118. After that, the dielectric film 110 and the insulating member 117 are dry-etched for the side (the side of the second surface) opposite to the side of the first surface. After the etching step, a metal wire 105 is exposed to the bottom of the hole 118. The hole 118 that is a hole with a bottom and extends through the dielectric film 110, the insulating member 117, and the interlayer dielectric film 104 is thus formed. At this time, the resist pattern is formed inside the outer diameter of the insulating member 117 filling the hole 116. Hence, a sidewall insulating member 115 as part of the insulating member 117 exists around the hole 118. The sidewall insulating member 115 electrically insulates a conductive member formed by burying a conductive material in the hole 118 for the silicon substrate 100. After the etching step, the resist pattern is removed. FIG. 4D is a sectional view at this time.

A barrier metal P01 and a conductive layer P02 are sequentially formed to fill the hole 118. After that, a resist pattern is formed on the conductive layer P02, and a pad P10 is formed. At this time, a light-shielding film 111 (not shown) is also simultaneously formed in each pixel. When burying the barrier metal P01 and the conductive layer P02, the hole 118 is also filled, thereby simultaneously forming a conductive member C10. FIG. 4E is a sectional view at this time. However, the pad P10 may separately be formed after burying the conductive member C10. According to this manufacturing method, both a first insulating layer 121 and a second insulating layer 122 are in contact with the conductive member C10.

After that, the steps of forming a color filter layer and an on-chip lens are performed, as in the first embodiment, thereby manufacturing a solid-state image sensor according to this embodiment. Unlike the second embodiment, a first through hole is formed after formation of the dielectric film. This makes it possible to omit the step of forming the conductive member C10 before formation of the wiring structure, as compared to the second embodiment.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2014-078231, filed Apr. 4, 2014, which is hereby incorporated by reference herein in its entirety.

What is claimed is:

1. A method of manufacturing a semiconductor device, comprising:
   a first step of forming a first hole opened to a side of a first surface of a semiconductor substrate, the semiconductor substrate including the first surface and a second surface opposite to the first surface;
   a step of filling the first hole with an insulating member;
   a step of forming, on the first surface, an insulating film that covers the insulating member;
   a step of forming a second hole in the insulating film and the insulating member;
   a step of filing the second hole with a conductive member; and
   a step of thinning the semiconductor substrate from the side of the second surface of the semiconductor substrate so as to expose the insulating member.

2. The method according to claim 1, wherein the second hole is formed from the side of the first surface, and
   the conductive member is buried from the side of the first surface.

3. The method according to claim 1, wherein the second hole is formed from the side opposite to the side of the first surface, and
   the conductive member is buried from the side opposite to the side of the first surface.

4. The method according to claim 1, further comprising a step of forming an electrode to be connected to the conductive member from the side opposite to the side of the first surface.

5. The method according to claim 1, wherein the insulating member buried in the first hole is formed from a plurality of types of insulating layers, and
   in the step of filling the first hole with the insulating member, out of the plurality of types of insulating layers, a first type of insulating layer is formed along an inner wall of the first hole, and then the first hole is filled with a second type of insulating layer.

6. The method according to claim 2, wherein the insulating member buried in the first hole is formed from a plurality of types of insulating layers, and
   in the step of forming the second hole, the second hole is formed so as to extend through a second type of insulating layer in a depth direction to expose a first type of insulating layer.

7. The method according to claim 5, wherein the first type of insulating layer comprises a silicon nitride layer, and the second type of insulating layer comprises a silicon oxide layer.

8. The method according to claim 1, further comprising a step of forming a semiconductor element on the first surface of the semiconductor substrate after the insulating member is buried in the first hole before the insulating film is formed.

9. The method according to claim 1, wherein the semiconductor substrate includes a photoelectric conversion portion.

* * * * *